(12) United States Patent
Lee et al.

(10) Patent No.: US 11,209,461 B2
(45) Date of Patent: Dec. 28, 2021

(54) PROBE CARD DEVICE AND NECK-LIKE PROBE THEREOF

(71) Applicant: CHUNGHWA PRECISION TEST TECH. CO., LTD., Taoyuan (TW)

(72) Inventors: Wen-Tsung Lee, New Taipei (TW); Hsun-Tai Wei, Taoyuan (TW); Kai-Chieh Hsieh, Taoyuan (TW); Wei-Jhih Su, Taichung (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 0 days.

(21) Appl. No.: 17/019,361

(22) Filed: Sep. 14, 2020

(65) Prior Publication Data

US 2021/0223289 A1 Jul. 22, 2021

(30) Foreign Application Priority Data

Jan. 21, 2020 (TW) .................................. 109102060

(51) Int. Cl.
*G01R 1/073* (2006.01)
*G01R 1/067* (2006.01)

(52) U.S. Cl.
CPC ..... *G01R 1/07307* (2013.01); *G01R 1/06733* (2013.01)

(58) Field of Classification Search
CPC ..................... G01R 1/07307; G01R 1/06733
See application file for complete search history.

(56) References Cited

U.S. PATENT DOCUMENTS

| | | | | |
|---|---|---|---|---|
| 6,294,922 B1* | 9/2001 | Okubo | ............... | G01R 1/06716 |
| | | | | 324/755.06 |
| 11,125,778 B2* | 9/2021 | Huang | ............... | G01R 1/07314 |
| 2009/0183898 A1* | 7/2009 | Kazama | ............. | G01R 1/07357 |
| | | | | 174/126.1 |
| 2018/0024166 A1* | 1/2018 | Acconcia | ........... | G01R 1/06733 |
| | | | | 324/750.25 |
| 2018/0052190 A1* | 2/2018 | Perego | ............... | G01R 1/06733 |
| 2019/0072584 A1* | 3/2019 | Su | ...................... | G01R 1/06733 |

* cited by examiner

*Primary Examiner* — Paresh Patel
(74) *Attorney, Agent, or Firm* — Li & Cai Intellectual Property Office

(57) ABSTRACT

A probe card device and a neck-like probe thereof are provided. The neck-like probe includes a conductive pin and a ring-shaped insulator. The conductive pin includes a stroke segment and two end segments extending from the stroke segment. The stroke segment has two broad side surfaces and two narrow side surfaces, and each of the broad side surfaces has a long slot extending from one of the narrow side surfaces to the other one. The two long slots have a minimum distance therebetween that is 75%-95% of a maximum distance between the two broad side surfaces. The ring-shaped insulator surrounds a portion of the conductive pin having the two long slots, and a portion of the neck-like probe corresponding in position to a part of the ring-shaped insulator on the two broad side surfaces has a thickness that is 85%-115% of the maximum distance.

8 Claims, 11 Drawing Sheets

PROBE CARD DEVICE AND NECK-LIKE PROBE THEREOF

CROSS-REFERENCE TO RELATED PATENT APPLICATION

This application claims the benefit of priority to Taiwan Patent Application No. 109102060, filed on Jan. 21, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a probe card device and a neck-like probe thereof.

BACKGROUND OF THE DISCLOSURE

A conventional conductive probe includes a conductive pin and an insulating layer that is formed on a central portion of the conductive pin. Any portions of the conductive pin have the same width and the same thickness, so that the insulating layer is formed as a protrusion. However, the cooperative configuration between the conductive pin and the insulating layer of the conventional conductive probe has been in use for many years, so that further development and progress of probe card devices are impeded.

SUMMARY OF THE DISCLOSURE

In response to the above-referenced technical inadequacies, the present disclosure provides a probe card device and a neck-like probe thereof to effectively improve on the issues associated with conventional conductive probes.

In one aspect, the present disclosure provides a probe card device, which includes a first guide unit, a second guide unit spaced apart from the first guide unit, and a plurality of neck-like probes. Each of the neck-like probes is in an elongated shape defining a longitudinal direction. Each of the neck-like probes has a probe length along the longitudinal direction thereof, and passes through and is held by the first guide unit and the second guide unit. Each of the neck-like probes includes a conductive pin and a ring-shaped insulator. The conductive pin includes a stroke segment and two end segments. The stroke segment is arranged between the first guide unit and the second guide unit, and has two broad side surfaces and two narrow side surfaces. Each of the two broad side surfaces of the stroke segment has a long slot extending from one of the two narrow side surfaces to the other one of the two narrow side surfaces. The two long slots are arranged adjacent to each other and have a minimum distance therebetween that is 75%-95% of a maximum distance between the two broad side surfaces. The two end segments respectively extend from two ends of the stroke segment to protrude from the first guide unit and the second guide unit. The ring-shaped insulator is arranged in the two long slots of the conductive pin and is formed on a portion of each of the two narrow side surfaces between the two long slots. A portion of the neck-like probe corresponding in position to a part of the ring-shaped insulator on the two broad side surfaces has a thickness that is 85%-115% of the maximum distance. When the first guide unit and the second guide unit are staggered in an oblique direction by a displacement distance that is 12%-19% of the probe length, the stroke segments of the neck-like probes are bent toward the same direction, and the two broad side surfaces of each of the stroke segments respectively have two inflection points that are respectively located in the two long slots thereof.

In another aspect, the present disclosure provides a neck-like probe of a probe card device, which includes a conductive pin and a ring-shaped insulator. The conductive pin includes a stroke segment and two end segments that respectively extend from two ends of the stroke segment. The stroke segment has two broad side surfaces and two narrow side surfaces. Each of the two broad side surfaces of the stroke segment has a long slot extending from one of the two narrow side surfaces to the other one of the two narrow side surfaces. The two long slots are arranged adjacent to each other and have a minimum distance therebetween that is 75%-95% of a maximum distance between the two broad side surfaces. The ring-shaped insulator surrounds a portion of stroke segment having the two long slots. A portion of the neck-like probe corresponding in position to a part of the ring-shaped insulator on the two broad side surfaces has a thickness that is 85%-115% of the maximum distance. When the two end segments of the neck-like probe are forced to bend the stroke segment, the two broad side surfaces respectively have two inflection points that are respectively located in the two long slots thereof.

Therefore, by virtue of "the probe card device" and "the neck-like probe" of the present disclosure, the conductive pin is formed with the two long slots to effectively control an abutting force thereof, so that when the conductive pin is used to abut against a device under test (DUT), the abutting force of the conductive pin can be maintained under a predetermined condition, and the conductive pin can be firmly abutted against and avoid destroying the DUT.

Moreover, the minimum distance of the conductive pin can be adjusted to change a reaction force generated from the neck-like probe when the neck-like probe is forced, thereby satisfying different requirements. Moreover, a ratio of the minimum distance to the maximum distance can be controlled to effectively maintain the signal transmission performance of the neck-like probe.

In addition, a portion of the ring-shaped insulator protruding from the broad side surfaces can be reduced by providing that the neck-like probe be formed with the two long slots, thereby protecting the ring-shaped insulator (e.g., when the neck-like probe is assembled to pass through the first guide unit, the ring-shaped insulator can effectively avoid being scratched by the first guide unit).

The curved portion of the neck-like probe can be controlled to be located at the two long slots by forming the two long slots (e.g., the inflection point is located in the long slot), so that the neck-like probes can be effectively controlled to bend along the same direction, and each of the neck-like probes is independently operated (e.g., is independently abutted against the DUT) and do not interfere with each other.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
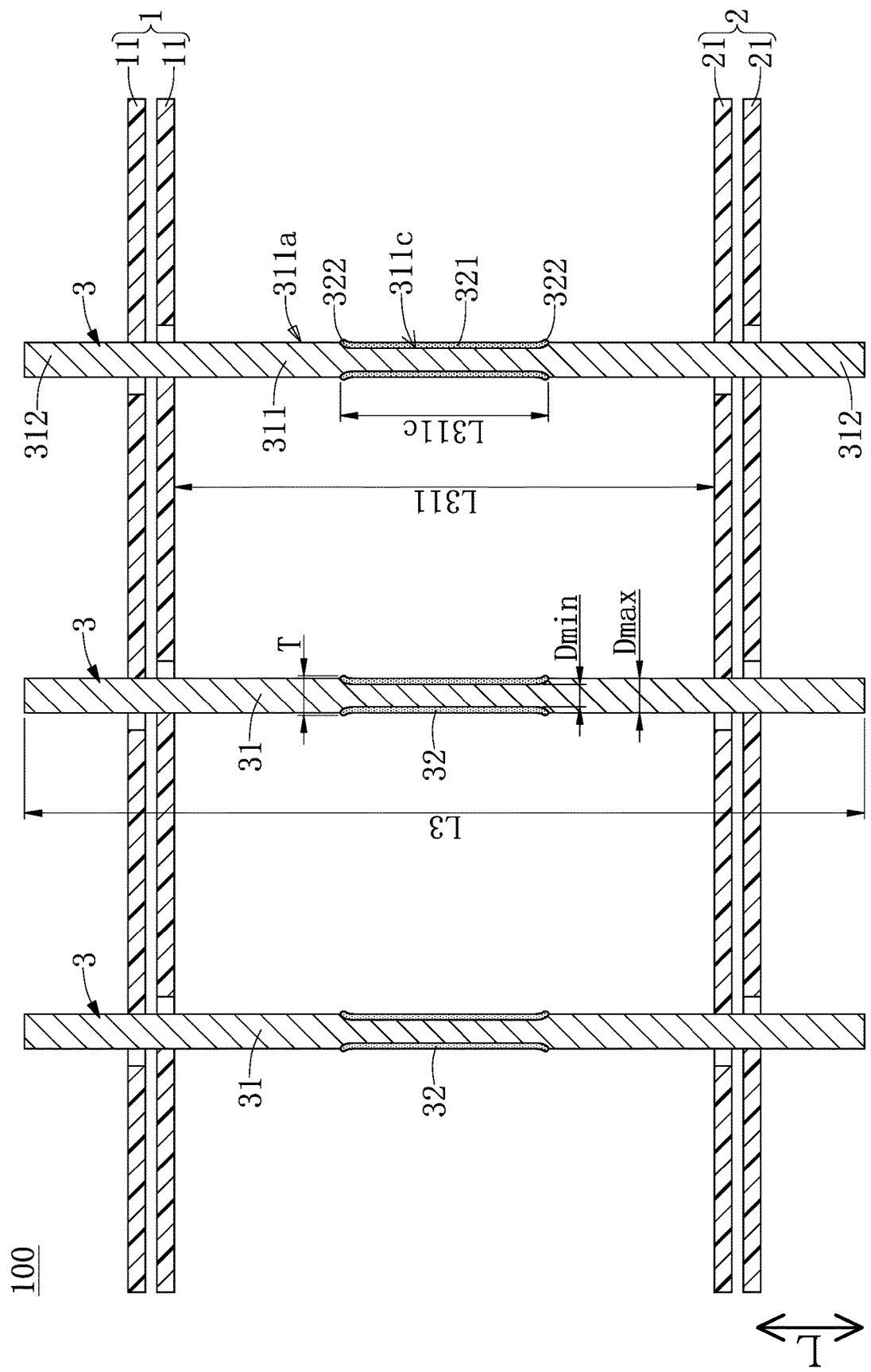
FIG. 1 is a cross-sectional view of a probe card device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
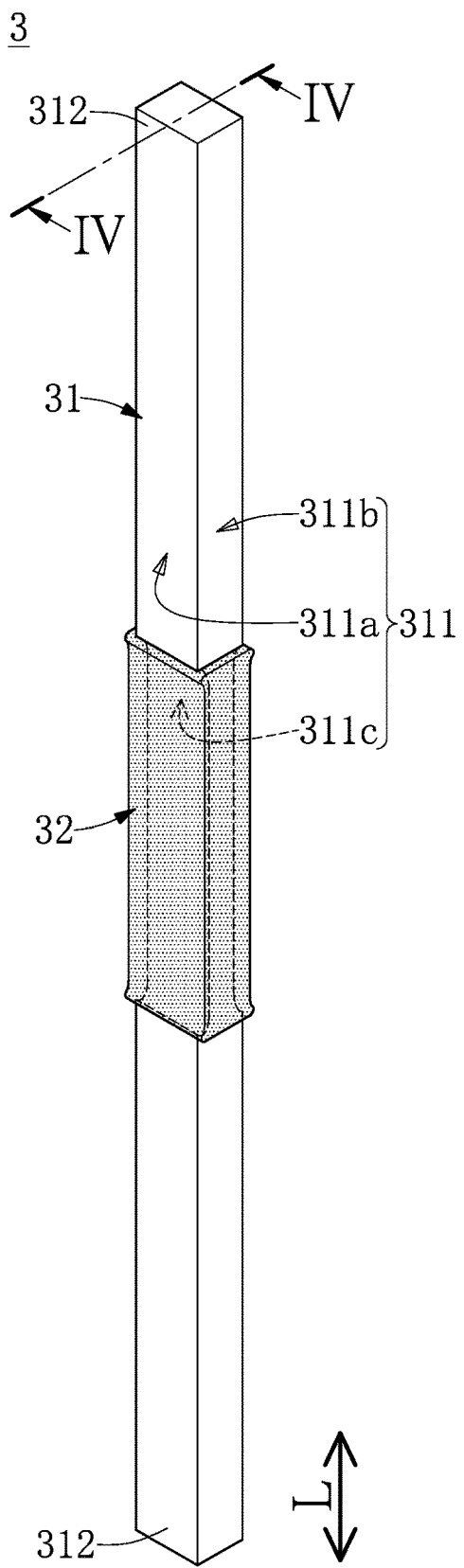
FIG. 2 is a perspective view of a neck-like probe according to the first embodiment of the present disclosure.
Figure 3:
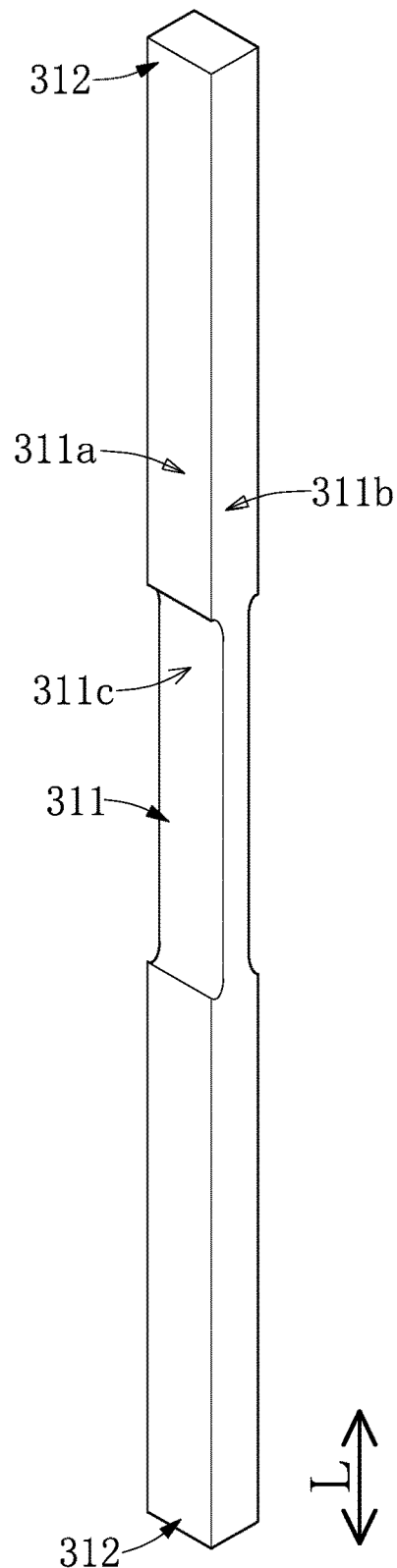
FIG. 3 is a perspective view showing a conductive pin of FIG. 2.

Referring to FIG. 1 to FIG. 9, a first embodiment of the present disclosure provides a probe card device 100. As shown in FIG. 1 to FIG. 3, two opposite sides of the probe card device 100 are configured to abut against a space transformer and a device under test (DUT) (e.g., a semiconductor wafer), respectively. The probe card device 100 includes a first guide unit 1, a second guide unit 2 spaced apart from the first guide unit 1, a spacer (not shown) sandwiched between the first guide unit 1 and the second guide unit 2, and a plurality of neck-like probes 3 that pass through and are held by the first guide unit 1 and the second guide unit 2.

It should be noted that the neck-like probes 3 in the present embodiment are described in cooperation with the first guide unit 1, the second guide unit 2, and the spacer, but the present disclosure is not limited thereto. For example, in other embodiments of the present disclosure, the neck-like probe 3 can be independently used (e.g., sold) or can be used in cooperation with other components.

In the present embodiment, the first guide unit 1 includes a plurality of first guide boards 11 (and at least one spacing sheet sandwiched between any two of the first guide boards 11 adjacent to each other). The second guide unit 2 includes a plurality of second guide boards 21 (and at least one spacing sheet sandwiched between any two of the second guide boards 21 adjacent to each other). The first guide boards 11 can be in a staggered arrangement, the second guide boards 21 can be in a staggered arrangement, and the first guide unit 1 and the second guide unit 2 can be in a staggered arrangement. However, in other embodiments of the present disclosure, the first guide unit 1 can include only one first guide board 11, and the second guide unit 2 can include only one second guide board 21.

Moreover, the spacer can be a ring-shaped structure sandwiched between peripheral portions of the first guide unit 1 and the second guide unit 2, but the present disclosure is not limited thereto. For example, in other embodiments of the present disclosure, the spacer of the probe card device 100 can be omitted or can be replaced by other components.

As the neck-like probes 3 in the present embodiment are of the same structure, the following description discloses the structure of just one of the neck-like probes 3 for the sake of brevity, but the present disclosure is not limited thereto. For example, in other embodiments of the present disclosure, the neck-like probes 3 can be of different structure.

Moreover, in the following description, the first guide boards 11 and the second guide boards 21 are each in the staggered arrangement, but the first unit 1 and the second unit 2 are not in the staggered arrangement for clearly describing the structure of the neck-like probe 3.

As shown in FIG. 1 to FIG. 4, the neck-like probe 3 is in an elongated shape defining a longitudinal direction L, and has a probe length L3 along the longitudinal direction L. Any cross section of the neck-like probe 3 perpendicular to the longitudinal direction L in the present embodiment is in the shape of a rectangle, but the present disclosure is not limited thereto. The neck-like probe 3 includes a conductive pin 31 and a ring-shaped insulator 32 that surrounds a substantially center portion of the conductive pin 31. In other words, any non-insulated member surrounding the conductive pin is different from the ring-shaped insulator 32 of the present embodiment.

The conductive pin 31 can be made of a copper alloy or a nickel alloy, and the conductive pin 31 in the present embodiment is integrally formed as a one piece structure and is in a straight shape, but the present disclosure is not limited thereto. The conductive pin 31 has a stroke segment 311 and two end segments 312 that integrally extend from two ends of the stroke segment 311, respectively. The stroke segment 311 is arranged between the first guide unit 1 and the second guide unit 2, and the two end segments 312 respectively protrude from the first guide unit 1 and the second guide unit 2.

An outer surface of the stroke segment 311 has two broad side surfaces 311a respectively arranged on two opposite sides thereof and two narrow side surfaces 311b respectively arranged on two opposite sides thereof. Each of the two broad side surfaces 311a of the stroke segment 311 has a long slot 311c extending from one of the two narrow side surfaces 311b to the other one of the two narrow side surfaces 311b. Moreover, the stroke segment 311 in the present embodiment does not have any protrusion formed on the two broad side surfaces 311a and the two narrow side surfaces 311b. In other words, any stroke segment having a protrusion for abutting against the first guide unit 1 or the second guide unit 2 is different from the stroke segment 311 of the present embodiment.

Accordingly, the conductive pin 31 is formed with the two long slots 311c to effectively control an abutting force thereof, so that when the conductive pin 31 is used to abut against the DUT, the abutting force of the conductive pin 31 can be maintained under a predetermined condition, and the conductive pin 31 can be firmly abutted against while avoiding damage to the DUT.

Figure 7:
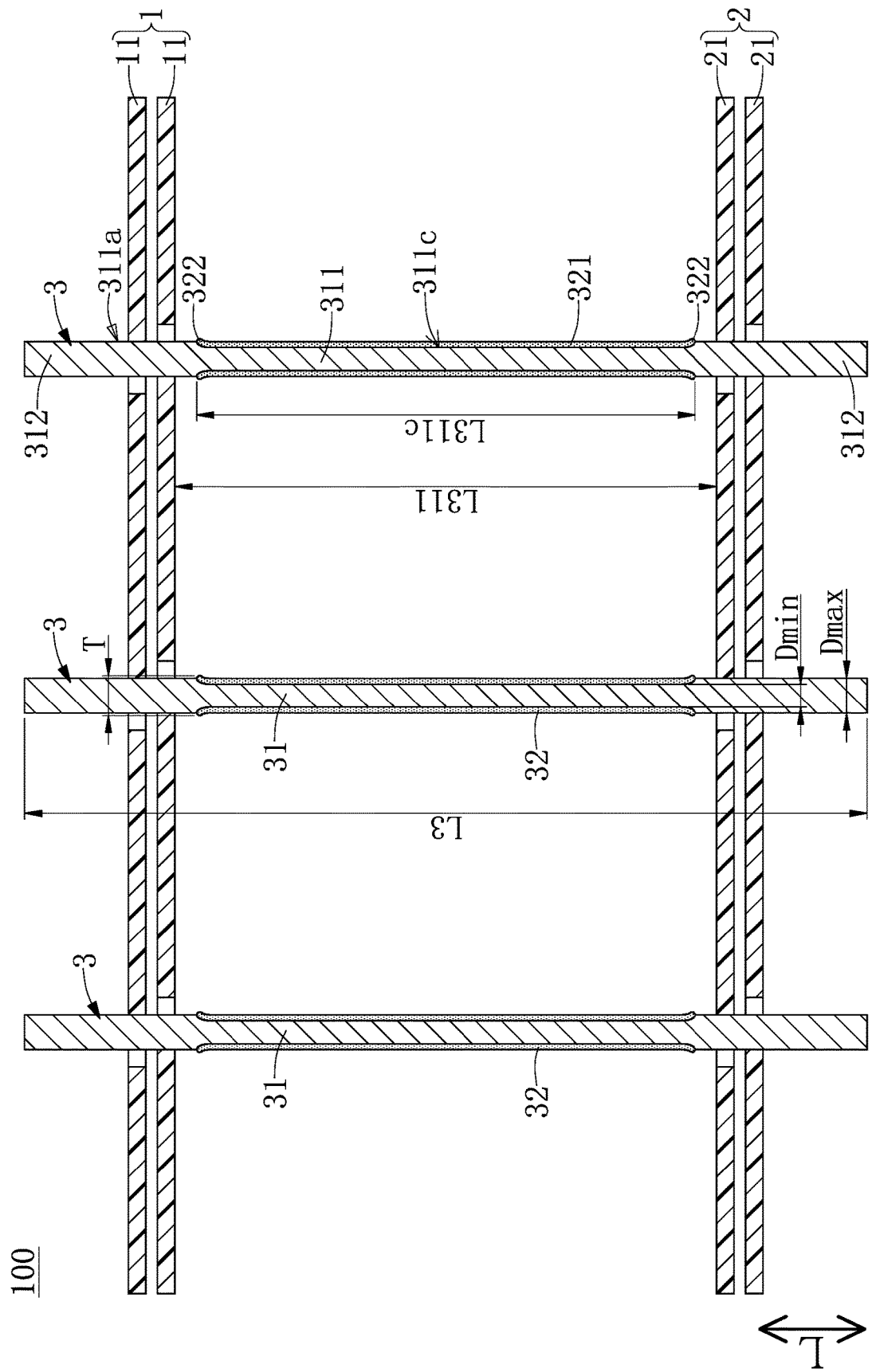
FIG. 7 is a cross-sectional view showing another configuration of the probe card device according to the first embodiment of the present disclosure.

Each of the two long slots 311c extends from one of the two narrow side surfaces 311b to the other one of the two narrow side surfaces 311b along a direction (e.g., a horizontal direction shown in FIG. 2) that is perpendicular to the longitudinal direction L. In other words, an extending distance or a width of each of the two long slots 311c is substantially equal to a distance between the two narrow side surfaces 311b. Moreover, a length L311c of any one of the two long slots 311c along the longitudinal direction L is at least 50% of a length L311 of the stroke segment 311 along the longitudinal direction L. For example, as shown in FIG. 1, the length L311c of the long slot 311c is 45%-60% of the length L311 of the stroke segment 311. Or, as shown in FIG. 7, the length L311c of the long slot 311c can be 80%-95% of the length L311 of the stroke segment 311.

Specifically, the two long slots 311c are arranged adjacent to each other and have a minimum distance Dmin therebetween (e.g., a distance between bottoms of the two long slots 311c) that is 75%-95% of a maximum distance Dmax between the two broad side surfaces 311a. Accordingly, the minimum distance Dmin of the conductive pin 31 can be adjusted to change a reaction force generated from the neck-like probe 3 when the neck-like probe 3 is acted upon by a force, thereby satisfying different requirements. Moreover, a ratio of the minimum distance Dmin to the maximum distance Dmax can be controlled to effectively maintain the signal transmission performance of the neck-like probe 3.

Figure 4:
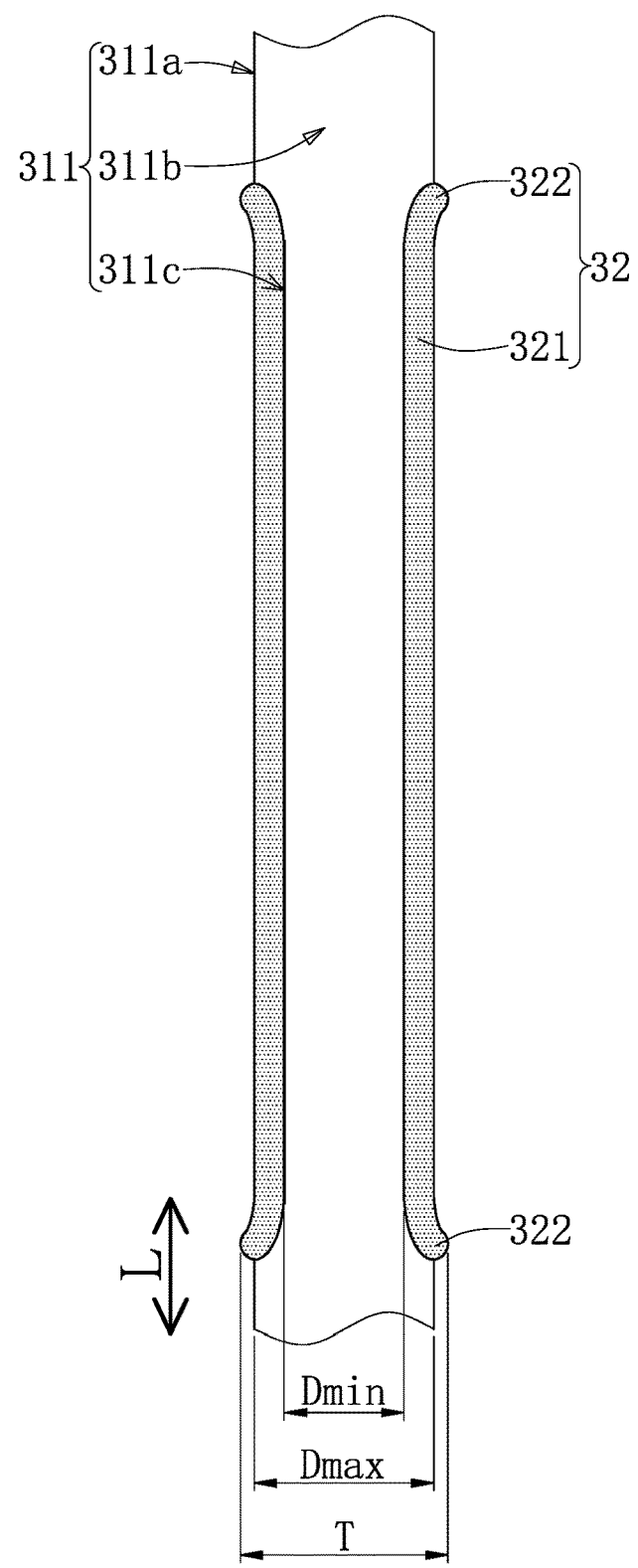
FIG. 4 is a cross-sectional view taken along line IV-IV of FIG. 2.
Figure 6:
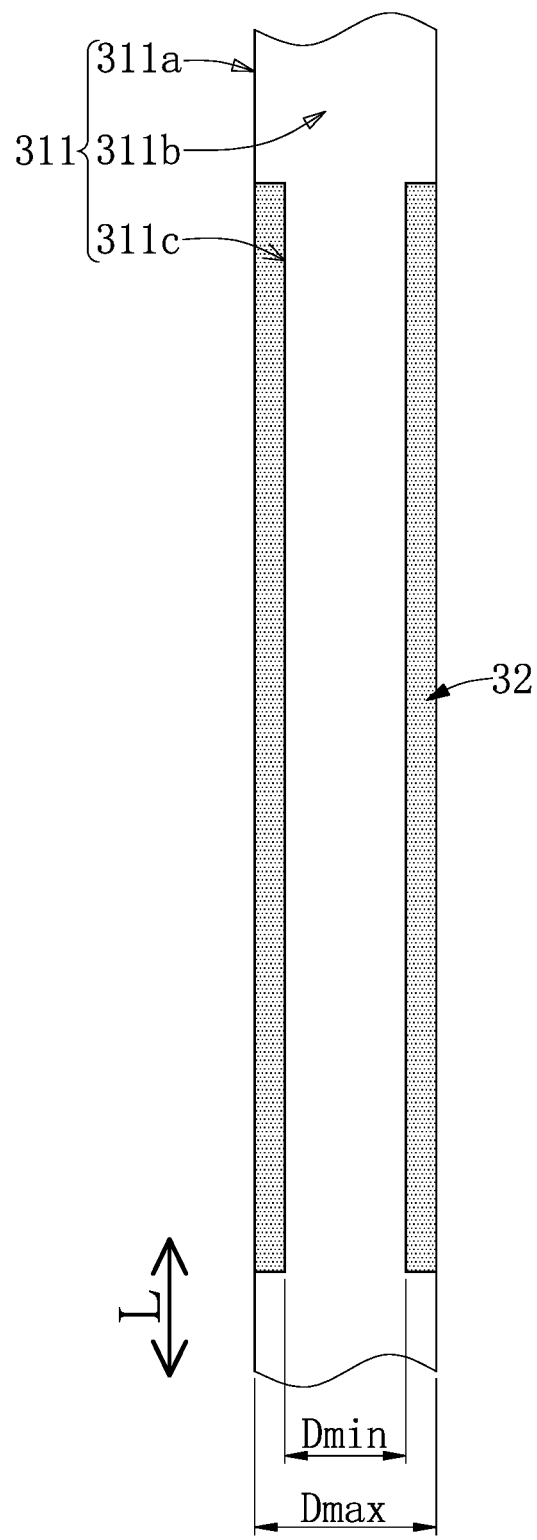
FIG. 6 is a cross-sectional view showing yet another configuration of FIG. 4.

Moreover, a distance between the two long slots 311c as shown in FIG. 4 of the present embodiment gradually decreases and then gradually increases along the longitudinal direction L, but the present disclosure is not limited thereto. For example, as shown in FIG. 6, the distance between the two long slots 311c can have the same value. Or, in other embodiments of the present disclosure, the structures of the two long slots 311c can be changed or adjusted according to design requirements.

As shown in FIG. 3, the two long slots 311c of the stroke segment 311 in the present embodiment are in a mirror-symmetrical arrangement, but the present disclosure is not limited thereto. For example, in other embodiments of the present disclosure, the two long slots 311c can have different depths or different lengths; or the two long slots 311c can be of different structure.

An outer surface of each of the end segments 312 has two broad side surfaces and two narrow side surfaces, and the two broad side surfaces and two narrow side surfaces of each of the end segments 312 in the present embodiment are respectively coplanar with the two broad side surfaces 311a and the two narrow side surfaces 311b of the stroke segment 311. In other words, each of the two end segments 312 in the present embodiment does not have any protrusion formed on the outer surface thereof, and the two end segments 312 are of the same rectangular column, but the present disclosure is not limited thereto. For example, any one of the two end segments 312 can have a protrusion according to design requirements.

Moreover, a portion of one of the two end segments 312 (e.g., the upper end segment 312 shown in FIG. 1) is arranged in thru-holes (not shown) of the first guide boards 11, and the other portion of the one of the two end segments 312 protrudes from the first guide boards 11, so that the one of the two end segments 312 can be fixed by staggeredly arranging the first guide boards 11. A portion of the other one of the two end segments 312 (e.g., the lower end segment 312 shown in FIG. 1) is arranged in thru-holes (not shown) of the second guide boards 21, and the other portion of the other one of the two end segments 312 protrudes from the second guide boards 21, so that the other one of the two end segments 312 can be fixed by staggeredly arranging the second guide boards 21.

The ring-shaped insulator 32 can be made of parylene, and any portions of the ring-shaped insulator 32 have the same thickness. The ring-shaped insulator 32 surrounds a portion of the conductive pin 31 having the two long slots 311c. In the present embodiment, the ring-shaped insulator 32 is arranged in the two long slots 311c of the conductive pin 311 and is formed on a portion of each of the two narrow side surfaces 311b between the two long slots 311c, but the present disclosure is not limited thereto.

Accordingly, a portion of the ring-shaped insulator 32 protruding from the broad side surfaces 311a can be reduced by providing the neck-like probe 3 to be formed with the two long slots 311c, thereby protecting the ring-shaped insulator 32 (e.g., when the neck-like probe 3 is assembled to pass through the first guide unit 1, the ring-shaped insulator 32 can effectively avoid being scratched by the first guide unit 1). In other words, the two long slots 311c of the conductive pin 31 can be filled with the ring-shaped insulator 32, so that the neck-like probe 3 can be formed in a substantial straight shape.

A portion of the neck-like probe 3 corresponding in position to a part of the ring-shaped insulator 32 on the two broad side surfaces 311a has a thickness T that is 85%-115% of the maximum distance Dmax. Moreover, the thickness T is preferably 90%-110% of the maximum distance Dmax. In other words, a part of the ring-shaped insulator 32 can slightly protrude from the two long slots 311c or can be arranged in the two long slots 311c, but the present disclosure is not limited thereto.

Specifically, the part of the ring-shaped insulator 32 on any one of the two broad side surfaces 311a has a filled portion 321 arranged in the corresponding long slot 311c and two end portions 322 that are respectively connected to two opposite sides of the filled portion 321 and that protrude from the corresponding long slot 311c (or a portion of the broad side surface 311a adjacent to the corresponding long slot 311c), and the two end portions 322 are configured to be boundaries defining the thickness T. Moreover, another part of the ring-shaped insulator 32 disposed on the two narrow side surfaces 311b has the form of a protrusion with respect to the conductive pin 31.

Figure 5:
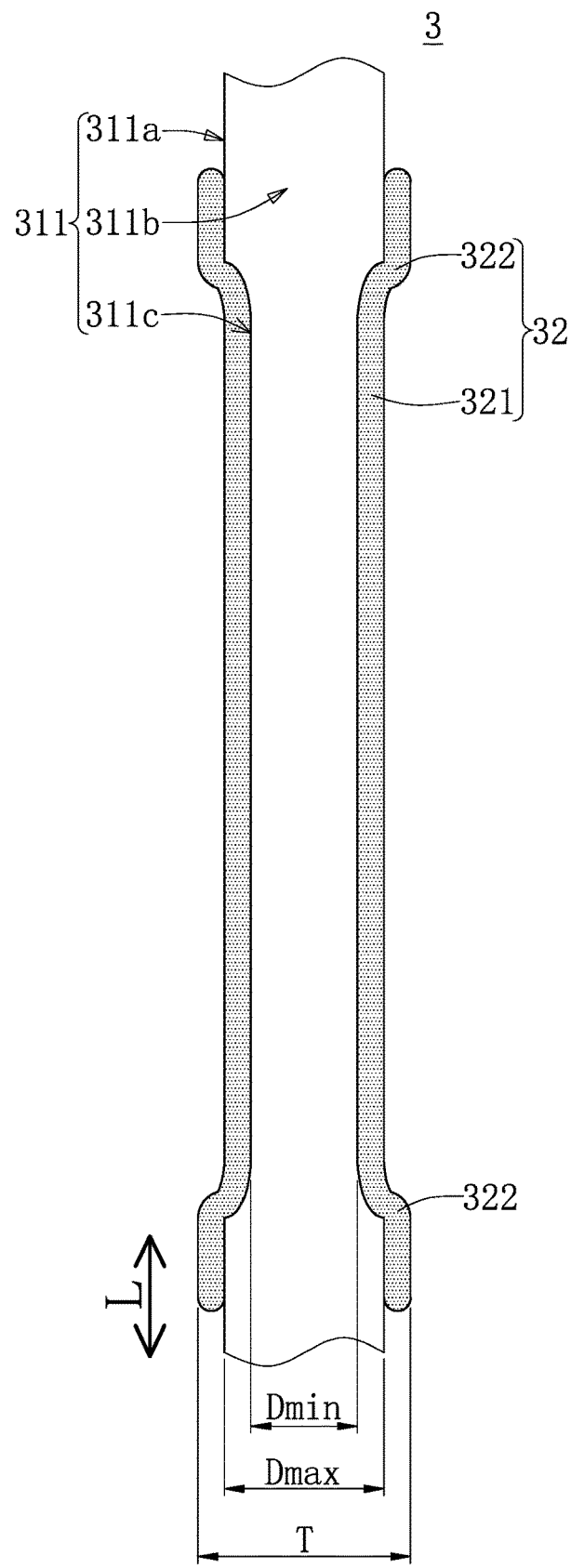
FIG. 5 is a cross-sectional view showing another configuration of FIG. 4.

The above description of the ring-shaped insulator 32 is based on FIG. 4 of the present embodiment, but the present disclosure is not limited thereto. For example, as shown in FIG. 5, the two end portions 322 of the ring-shaped insulator 32 can further extend to the broad side surface 311a outside of any one of the long slots 311c. Or, as shown in FIG. 6, the ring-shaped insulator 32 does not protrude from the two long slots 311c and can be coplanar with any one of the broad side surfaces 311a outside of the corresponding long slot 311c.

In the above description, the structure of the neck-like probe 3 is described under the premise that the first guide unit 1 and the second guide unit 2 are not in the staggered arrangement, and in the following description, the neck-like probes 3 are described under the premise that the first guide unit 1 and the second guide unit 2 are in the staggered arrangement.

Figure 8:
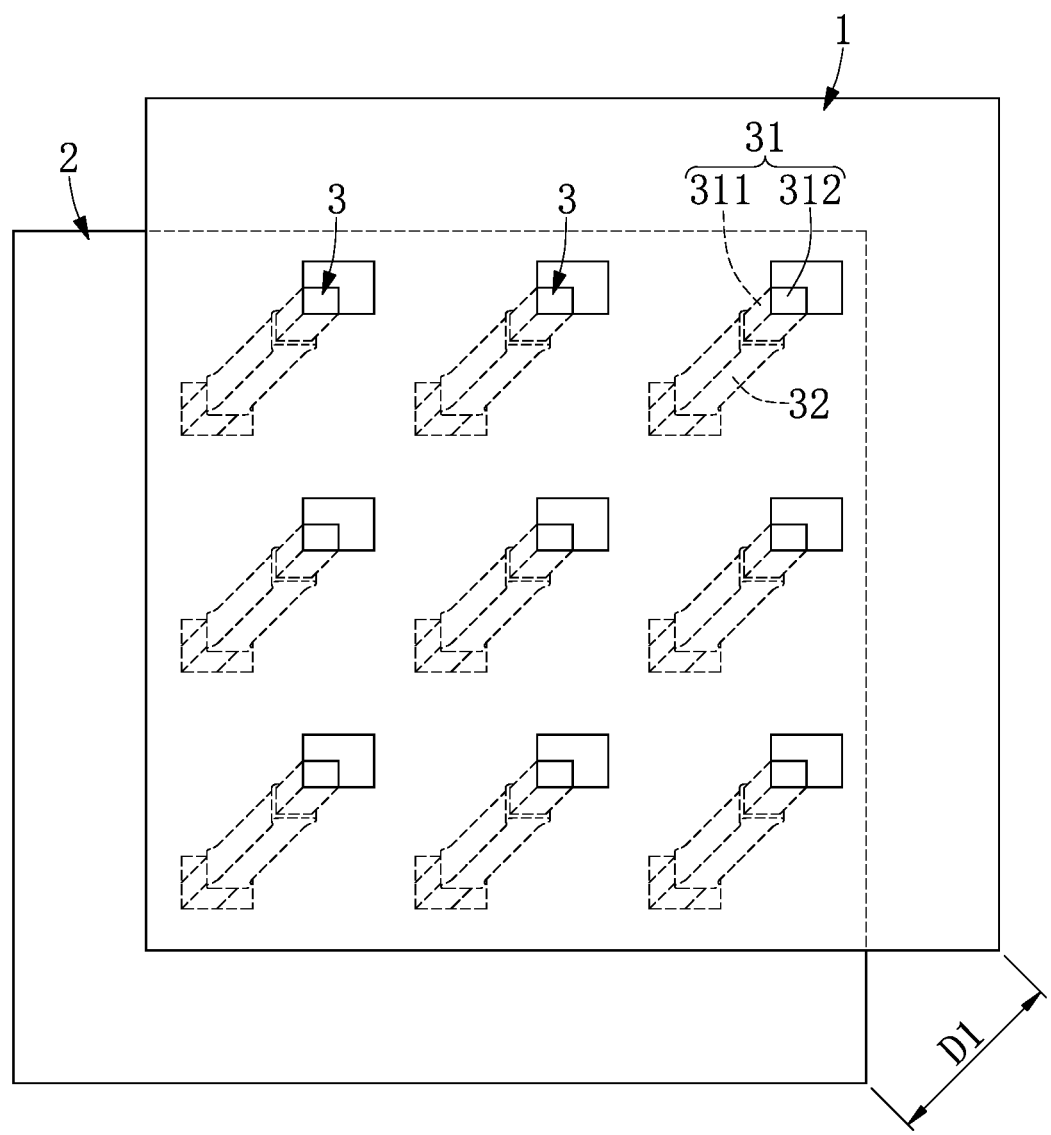
FIG. 8 is a top view showing the probe card device of FIG. 1 when a first guide unit and a second guide unit are in a staggered arrangement.
Figure 9:
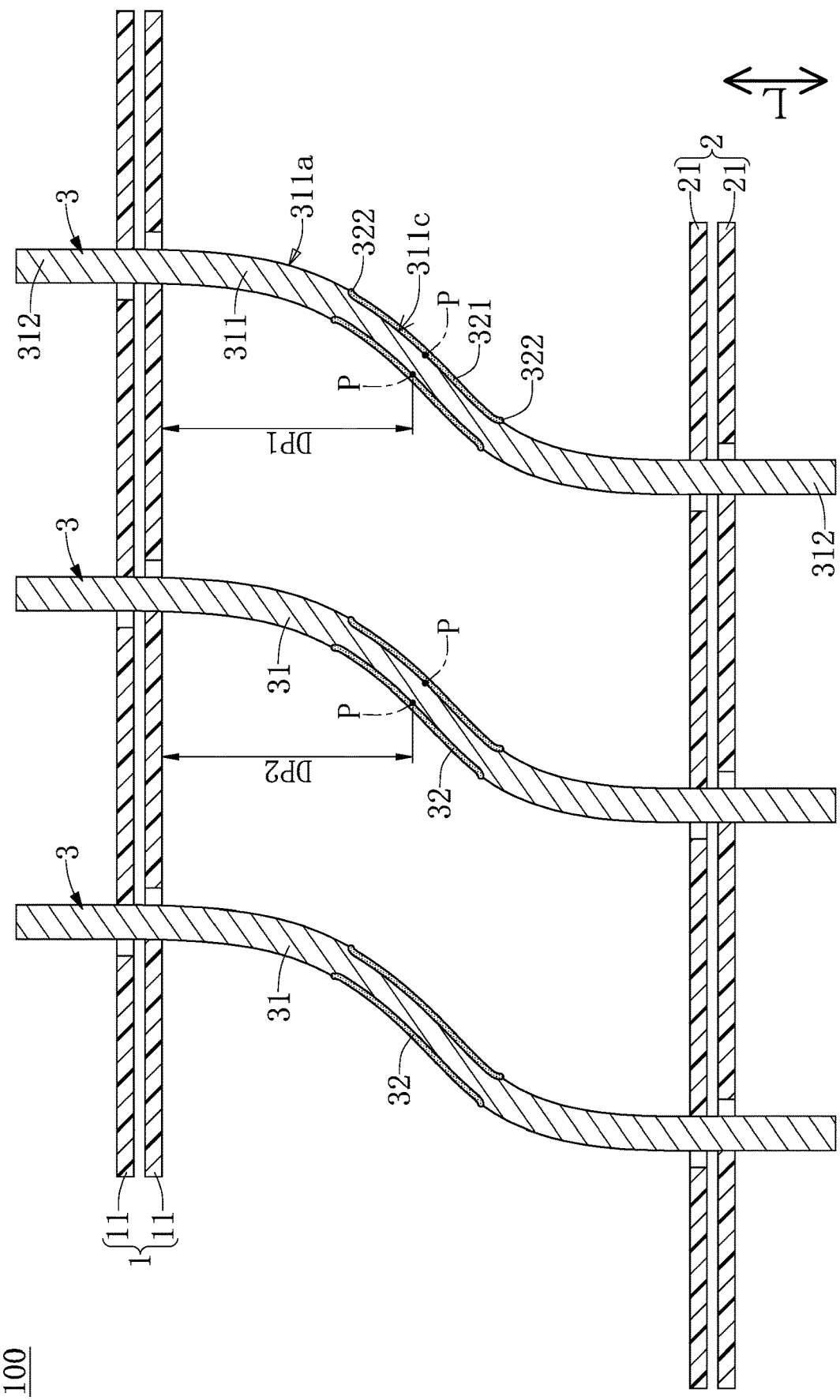
FIG. 9 is a cross-sectional view showing the probe card device of FIG. 1 when the first guide unit and the second guide unit are in the staggered arrangement.

Specifically, as shown in FIG. 8 and FIG. 9, when the first guide unit 1 and the second guide unit 2 are staggered in an oblique direction by a displacement distance D1 that is 12%-19% of the probe length L3 (shown in FIG. 1), the stroke segments 311 of the neck-like probes 3 are bent toward the same direction, and the two broad side surfaces 311a of each of the stroke segments 311 respectively have two inflection points P that are respectively located in the two long slots 311c thereof. Specifically, two of the inflection points P (e.g., any two of the inflection points P located on the upper sides of the neck-like probes 3 shown in FIG. 9) respectively belonging to any two of the neck-like probes 3 and facing the same side are each spaced apart from the first guide unit 1 by a distance DP1, DP2, and the distances DP1, DP2 defined by the two of the inflection points P have a difference that is less than or equal to 1% of the probe length L3 (shown in FIG. 1).

Accordingly, by forming the two long slots 311c, the curved portion of the neck-like probe 3 can be controlled to be located at the two long slots 311c (e.g., the inflection point P is located in the long slot 311c), so that the neck-like probes 3 can be effectively controlled to bend along the same direction, and each of the neck-like probes 3 can be independently operated (e.g., is independently abutted against the DUT) and they do not interfere with each other.

Second Embodiment

Figure 10:
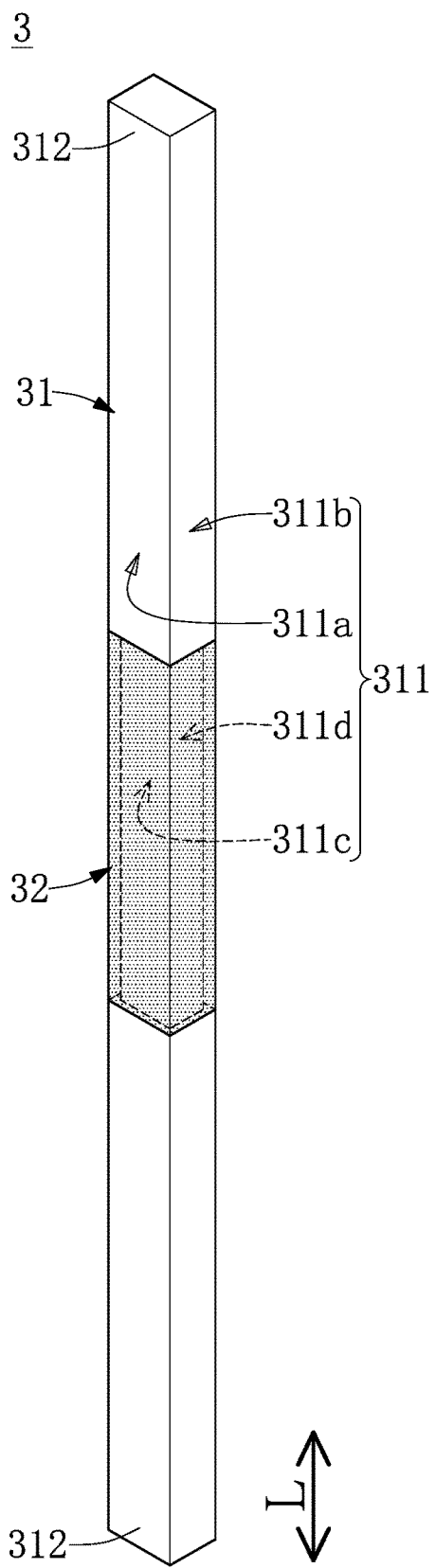
FIG. 10 is a perspective view of a neck-like probe according to a second embodiment of the present disclosure.
Figure 11:
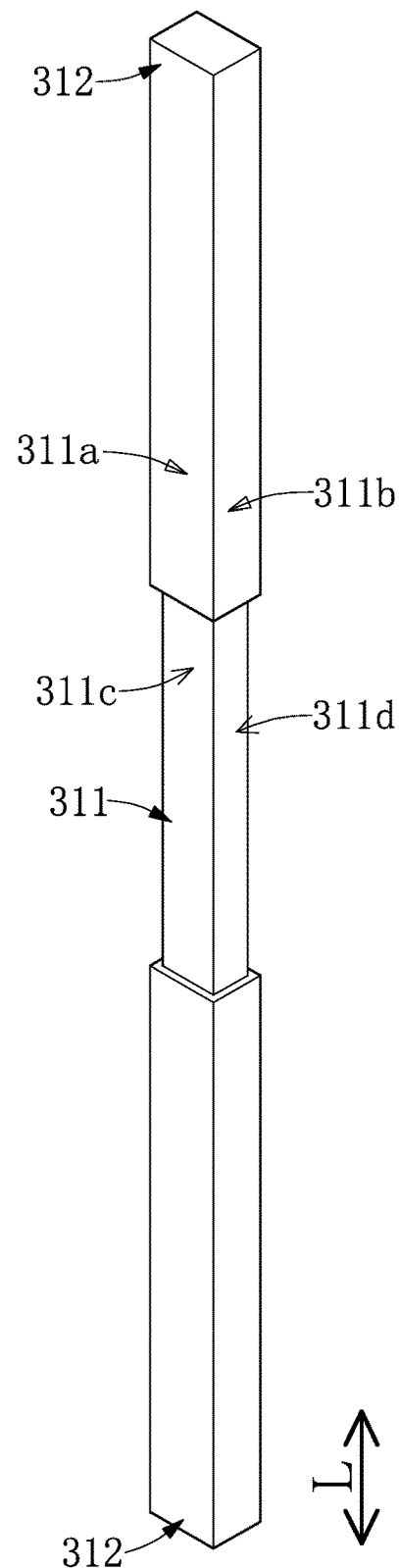
FIG. 11 is a perspective view showing a conductive pin of FIG. 10.

Referring to FIG. 10 and FIG. 11, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

In the present embodiment, each of the two narrow side surfaces 311b of the stroke segment 311 has a short slot 311d having two opposite ends being respectively in spatial communication with the two long slots 311c. In other words, the two long slots 311c and the two short slots 311d are jointly formed as a rectangular ring-shaped groove. Moreover, the two long slots 311c are in a mirror-symmetrical arrangement, and the two short slots 311d are in a mirror-symmetrical arrangement, but the present disclosure is not limited thereto. For example, in other embodiments of the present disclosure, the two short slots 311d can have different depths or lengths; or, the two short slots 311d can be of different structure.

Moreover, the ring-shaped insulator 32 is arranged in the two long slots 311c and the two short slots 311d. In the present embodiment, the ring-shaped insulator 32 does not protrude from any one of the two long slots 311c and is coplanar with the two broad side surfaces 311a outside of the rectangular ring-shaped groove, but the present disclosure is not limited thereto. For example, in other embodiments of the present disclosure, the ring-shaped insulator 32 can have an end portion protruding from at least one of the two short slots 311d; or, the ring-shaped insulator 32 can further have a portion extending from the end portion to the narrow side surface 311b adjacent to the short slot 311d.

In conclusion, by virtue of "the probe card device" and "the neck-like probe" of the present disclosure, the conductive pin 31 is formed with the two long slots 311c to effectively control an abutting force thereof, so that when the conductive pin 31 is used to abut against the DUT, the abutting force of the conductive pin 31 can be maintained under a predetermined condition, and the conductive pin 31 can be firmly abutted against while avoiding damage to the DUT.

Moreover, the minimum distance Dmin of the conductive pin 31 can be adjusted to change a reaction force generated from the neck-like probe 3 when the neck-like probe 3 is acted upon by a force, thereby satisfying different requirements. Moreover, a ratio of the minimum distance Dmin to the maximum distance Dmax can be controlled to effectively maintain the signal transmission performance of the neck-like probe 3.

In addition, a portion of the ring-shaped insulator 32 protruding from the broad side surfaces 311a can be reduced by providing the neck-like probe 3 to be formed with the two long slots 311c, thereby protecting the ring-shaped insulator 32 (e.g., when the neck-like probe 3 is assembled to pass through the first guide unit 1, the ring-shaped insulator 32 can effectively avoid being scratched by the first guide unit 1).

Moreover, by forming the two long slots 311c, the curved portion of the neck-like probe 3 can be controlled to be located at the two long slots 311c (e.g., the inflection point P is located in the long slot 311c), so that the neck-like probes 3 can be effectively controlled to bend along the same direction, and each of the neck-like probes 3 can be independently operated (e.g., is independently abutted against the DUT) and they do not interfere with each other.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device, comprising:
a first guide unit and a second guide unit that is spaced apart from the first guide unit; and
a plurality of neck-like probes each being in an elongated shape defining a longitudinal direction, wherein each of the neck-like probes has a probe length along the longitudinal direction thereof, and passes through and is held by the first guide unit and the second guide unit, and wherein each of the neck-like probes includes:
a conductive pin including:
a stroke segment arranged between the first guide unit and the second guide unit and having two broad side surfaces and two narrow side surfaces, wherein each of the two broad side surfaces of the stroke segment has a long slot extending from one of the two narrow side surfaces to the other one of the two narrow side surfaces, and wherein the two long slots are arranged adjacent to each other and have a minimum distance therebetween that is 75%-95% of a maximum distance between the two broad side surfaces; and
two end segments respectively extending from two ends of the stroke segment to protrude from the first guide unit and the second guide unit; and
a ring-shaped insulator arranged in the two long slots of the conductive pin and formed on a portion of each of the two narrow side surfaces between the two long slots, wherein a portion of the neck-like probe corresponding in position to a part of the ring-shaped insulator on the two broad side surfaces has a thickness that is 85%-115% of the maximum distance,
wherein when the first guide unit and the second guide unit are staggered in an oblique direction by a displacement distance that is 12%-19% of the probe length, the stroke segments of the neck-like probes are bent toward the same direction, and the two broad side surfaces of each of the stroke segments respectively have two inflection points that are respectively located in the two long slots thereof.

2. The probe card device according to claim 1, wherein in each of the neck-like probes, the two long slots of the stroke segment are in a mirror-symmetrical arrangement, and each of the two long slots extends from one of the two narrow side surfaces to the other one of the two narrow side surfaces along a direction that is perpendicular to the longitudinal direction.

3. The probe card device according to claim 1, wherein when the first guide unit and the second guide unit are staggered in the oblique direction, two of the inflection points respectively belonging to any two of the neck-like probes and facing the same side are each spaced apart from the first guide unit by a distance, and the distances defined by the two of the inflection points have a difference that is less than or equal to 1% of the probe length.

4. The probe card device according to claim 1, wherein in each of the neck-like probes, the part of the ring-shaped insulator on any one of the two broad side surfaces has a filled portion arranged in the corresponding long slot and two end portions that are respectively connected to two opposite sides of the filled portion and that protrude from the corresponding long slot, and the two end portions are configured to be boundaries defining the thickness.

5. The probe card device according to claim 1, wherein in each of the neck-like probes, a length of any one of the two long slots along the longitudinal direction is at least 50% of a length of the stroke segment along the longitudinal direction.

6. The probe card device according to claim 1, wherein in each of the neck-like probes, the conductive pin is in a straight shape, and the stroke segment does not have any protrusion formed on the two broad side surfaces and the two narrow side surfaces.

7. The probe card device according to claim 6, wherein the first guide unit includes a plurality of first guide boards, and the second guide unit includes a plurality of second guide boards, and wherein in each of the neck-like probes, one of the two end segments is fixed by staggeredly arranging the first guide boards, and the other one of the two end segments is fixed by staggeredly arranging the second guide boards.

8. A neck-like probe of a probe card device, comprising:
a conductive pin including:
a stroke segment having two broad side surfaces and two narrow side surfaces, wherein each of the two broad side surfaces of the stroke segment has a long slot extending from one of the two narrow side surfaces to the other one of the two narrow side surfaces, and wherein the two long slots are arranged adjacent to each other and have a minimum distance therebetween that is 75%-95% of a maximum distance between the two broad side surfaces; and
two end segments respectively extending from two ends of the stroke segment; and
a ring-shaped insulator surrounding a portion of the stroke segment having the two long slots, wherein a portion of the neck-like probe corresponding in position to a part of the ring-shaped insulator on the two broad side surfaces has a thickness that is 85%-115% of the maximum distance,
wherein when the two end segments of the neck-like probe are acted upon by a force so as to bend the stroke segment, the two broad side surfaces respectively have two inflection points that are respectively located in the two long slots thereof.

* * * * *